United States Patent
Sato

[11] Patent Number: 6,049,556
[45] Date of Patent: Apr. 11, 2000

[54] VERTICAL CAVITY SURFACE EMITTING LASER DIODE OPERABLE IN 1.3 $\mu$M OR 1.5 $\mu$M WAVELENGTH BAND WITH IMPROVED EFFICIENCY

[75] Inventor: Shunichi Sato, Miyagi, Japan

[73] Assignee: Ricoh Company, Ltd., Tokyo, Japan

[21] Appl. No.: 09/260,567

[22] Filed: Mar. 2, 1999

Related U.S. Application Data

[62] Division of application No. 08/921,149, Aug. 29, 1997, Pat. No. 5,923,691.

[30] Foreign Application Priority Data

Aug. 30, 1996 [JP] Japan ................................. 8-248925

[51] Int. Cl.$^7$ ........................................................ H01S 3/19
[52] U.S. Cl. .................................................. 372/46; 372/96
[58] Field of Search ................................ 372/96, 92, 46, 372/45

[56] References Cited

U.S. PATENT DOCUMENTS

| | | | |
|---|---|---|---|
| 5,561,681 | 10/1996 | Nishimura | 372/46 |
| 5,912,913 | 6/1999 | Kondow et al. | 372/45 |
| 5,943,357 | 8/1999 | Lebby et al. | 372/96 |
| 5,956,363 | 9/1999 | Lebby et al. | 372/46 |

FOREIGN PATENT DOCUMENTS

| | | |
|---|---|---|
| 6-37355 | 2/1994 | Japan . |
| 07154023 | 6/1995 | Japan . |
| 07193327 | 7/1995 | Japan . |

OTHER PUBLICATIONS

Miyashi, et al. "Growth parameters for metastable GaP1x–Nx alloys in MOVPE" (Inst. Phys. Conf. Ser. No. 141:2 (1994)) Sep., 1994, pp. 97–100.

*Primary Examiner*—Rodney Bovernick
*Assistant Examiner*—Quyen P. Leung
*Attorney, Agent, or Firm*—Dickstein Shapiro Morin & Oshinsky LLP

[57] ABSTRACT

A vertical cavity surface emitting laser diode includes an active layer of a group III–V compound semiconductor device containing N and As as the group V elements. The active layer has exposed lateral edges wherein the N atoms are substituted by the As atoms at the exposed lateral edges by an annealing process conducted in a AsH$_3$ atmosphere.

4 Claims, 6 Drawing Sheets y for As are adjusted appropriately.
VERTICAL CAVITY SURFACE EMITTING LASER DIODE OPERABLE IN 1.3 μM OR 1.5 μM WAVELENGTH BAND WITH IMPROVED EFFICIENCY This is a divisional of U.S. Pat. Ser. No. 08/921,149, filed Aug. 29, 1997, now U.S. Pat. No. 5,923,691, the entire disclosure of which is incorporated herein by reference.

BACKGROUND OF THE INVENTION

The present invention generally relates to optical semiconductor devices and more particularly to an optical semiconductor device operable in a 1.3 μm or 1.5 μm wavelength band.

Today, a telecommunication trunk generally uses an optical telecommunication system in which optical fibers carry information traffic in the form of optical signals. Currently, quartz glass optical fibers having an optical transmission band of 1.3 μm or 1.5 μm wavelength are used commonly. In correspondence to the foregoing specific transmission band of the optical fibers, current optical telecommunication systems generally use a GaInAsP double-heterojunction laser diode that includes an active layer of $In_{1-x}Ga_xAs_yP_{1-y}$ and a cladding layer of InP. In such a GaInAsP double-heterojunction laser diode, the carriers are accumulated in the active layer by a potential barrier formed in the conduction band and the valence band between the GaInAsP active layer and the InP cladding layer, and stimulated emission of photons is substantially facilitated in the active layer by the carriers thus accumulated therein. In order to obtain a laser oscillation at the wavelength that matches the optical transmission band of the quartz glass optical fibers, the compositional parameter x for Ga and the compositional parameter y for As are adjusted appropriately.

However, such a conventional laser diode that uses a double-heterojunction of GaInAsP and InP has suffered from the problem of relatively large threshold current of laser oscillation and poor temperature characteristic, primarily due to the relatively small band discontinuity (ΔEc) of the conduction band between the GaInAsP active layer and the InP cladding layer. More specifically, the electrons escape easily from the active layer in such an GaInAsP laser diode because of the small potential barrier ΔEc formed by the foregoing band discontinuity, and a large drive current has to be supplied in order to sustain a laser oscillation in the active layer. This problem becomes particularly acute at high temperatures in which the carriers experience an increased degree of thermal excitation. Further, the foregoing GaInAsP laser diode has a problem in that the laser oscillation wavelength tends to shift to a longer wavelength side at high temperatures due to the temperature dependence of the bandgap of GaInAsP. It should be noted that the bandgap of GaInAsP decreases with temperature. This shift of the laser oscillation wavelength raises a serious problem particularly in a wavelength multiplex transmission process of optical signals.

In order to avoid the foregoing problems, conventional GaInAsP double-heterojunction laser diodes for use in optical telecommunication trunk or submarine optical cable systems have used a temperature regulation device, such as a Peltier cooling device, such that the operational temperature of the laser diode is maintained at a predetermined temperature.

On the other hand, there is a strong impetus to expand the use of optical telecommunication technology from the telecommunication trunks to subscriber systems or home systems. In relation to this, there is a demand for an optical semiconductor device suitable for use in home terminals.

When realizing such optical home terminals, it is essential that the optical home terminal is compact and low cost. Further, the optical home terminal should consume little electric power. In order to meet such demands, it is necessary to provide a laser diode that is operable in the 1.3 or 1.5 μm band with a low threshold current and simultaneously without a temperature regulation.

As long as the foregoing GaInAsP/InP double-heterojunction system is used, the foregoing demand cannot be satisfied. Thus, efforts are being made to construct a laser diode having an active layer of GaInAs on a GaAs substrate such that a large band discontinuity ΔEc is secured in the conduction band. By increasing the In content in the GaInAs active layer, it is possible to reduce the bandgap energy Eg of the active layer, and the oscillation wavelength of the laser diode approaches the desired 1.3 μm band. However, such an increase of the oscillation wavelength by increasing the In content in the GaInAs active layer is successful only to the point in which the oscillation wavelength reaches about 1.1 μm. Beyond that, the lattice misfit between the GaInAs active layer and the GaAs substrate becomes excessive and the epitaxial growth of the GaInAs active layer on the GaAs substrate is no longer possible. It should be noted that the foregoing limit of 1.1 μm takes into consideration the contribution of compressive strain that acts in the direction to increase the oscillation wavelength of the laser diode.

In view of the foregoing situation, Japanese Laid-Open Patent Publication 7-193327 proposes a laser diode operable in the 1.3 or 1.5 μm band, in which an active layer of GaInAs is sandwiched by a pair of cladding layers having a composition set such that a large band discontinuity ΔEc is secured between the active layer and the cladding layer and that the cladding layer has simultaneously a lattice constant close to that of a strained buffer layer provided on a GaAs substrate with a composition of $Ga_{0.8}In_{0.2}As$. However, the proposed device is deemed to be unrealistic in view of the large lattice misfit between the active layer and the GaAs substrate. It is believed that the existence of such a large lattice misfit reduces the lifetime of the laser diode substantially.

On the other hand, Japanese Laid-Open Patent Publication 6-37355 describes a compound semiconductor structure that includes a GaInNAs mixed crystal film formed on a GaAs substrate. By adding N to GaInAs, it becomes possible to form the GaInNAs film with a lattice constant that matches the lattice constant of GaAs. The GaInNAs film thus added with N has a reduced bandgap due to a large negative bowing of the bandgap-composition relationship observed in a GaAs-GaN system. Thus, it is expected that a double-heterostructure laser diode having an oscillation wavelength in the 1.3 or 1.5 μm and simultaneously a large band discontinuity ΔEc necessary for carrier accumulation, may be obtained by using GaInNAs for the active layer. As the GaInNAs film can have a composition that establishes a lattice matching with GaAs, it is possible to use an AlGaAs or GaAs cladding in combination with the active layer of GaInNAs.

FIG. 1 shows the compositional change of a bandgap Eg for a GaAs-GaN system according to the Japanese Laid-open Patent Publication 6-37355.

Referring to FIG. 1, it will be noted that the endmember component GaN has a very large bandgap Eg of about 3.5 eV, contrary to the endmember component GaAs, of which bandgap Eg is only about 1.4 eV. Thus, GaN is expected to be one of the most promising materials of an active layer for an optical semiconductor device that is operable in a blue or ultraviolet wavelength band.

The striking feature of FIG. 1 is that the compositional change of the bandgap Eg between GaAs and GaN is not linear but there appears a very significant negative bowing. Probably, this large negative bowing of bandgap is related to the existence of a very large difference in the atomic radius between As and N. In fact, there is reported a large miscibility gap in the GaAs-GaN system.

Thus, a bandgap Eg as small as about 1.2 eV is possible for a GaNAs system by incorporating N into a GaAs crystal with a proportion of about 10 mole %. While the GaNAs system of this composition has a small lattice constant due to the small atomic radius of N, a satisfactory lattice matching can be achieved, with respect to a GaAs substrate, by incorporating In.

FIG. 2 shows the construction of a laser diode 1 proposed in the Japanese Laid-Open Patent Publication 7-154023, op cit.

Referring to FIG. 2, the laser diode 1 is constructed on a substrate 10 of n-type GaAs and includes a lower cladding layer 11 of n-type GaInP provided on the GaAs substrate 10. On the lower cladding layer 11, an active layer 12 of undoped GaInNAs is provided, and an upper cladding layer 13 of p-type GaInP is provided further on the active layer 12, wherein the upper cladding layer 13 is formed with a ridge structure extending in an axial direction of the laser diode. Further, a pair of current confinement structures 14 of n-type GaAs are provided at both lateral sides of the ridge structure, and a contact layer 15 of p-type GaAs is provided on the ridge structure so as to bury the current confinement structures 14 underneath. Further, a p-type ohmic electrode 16 is provided on the contact layer 15, and an n-type ohmic electrode 17 is provided on the bottom surface of the substrate 10.

In operation, holes are injected into the active layer 12 from the electrode 16 via the contact layer 15 and the ridge structure of the upper cladding layer 13, wherein the active layer 12 is further injected with electrons from the electrode 17 via the substrate 10 and the lower cladding layer. Thereby, a stimulated emission of photons occur in the active layer 12 as a result of recombination of the electrons and holes thus accumulated in the active layer 12, and the laser diode oscillates at the wavelength of 1.3 $\mu$m or 1.5 $\mu$m corresponding to the characteristically increased bandgap of the active layer 12.

In the laser diode of FIG. 2, the current confinement structures 14 restricts the current path of the holes by establishing a p-n junction between the current confinement structure 14 and the contact layer 15, wherein it should be noted that each current confinement structure 14 is formed above the active layer 12, with a part of the upper cladding layer 13 intervening between the current confinement structure 14 and the active layer 12.

While it is usual in conventional laser diodes to form a current confinement structure corresponding to the current confinement structure 14, such that the current confinement structure reaches the lower cladding layer 11 or to the substrate 10, across the active layer 12, such a construction, when applied to the active layer 12 having the composition of GaInNAs, would cause a problem of extensive defect formation at the lateral edges of the active layer 12 where the active layer 12 is laterally bounded by the GaAs current confinement structures 14. It should be noted that such a formation of the current confinement structure includes a mesa formation step for forming the ridge structure, while the etching process used in such a mesa formation step tends to introduce a substantial amount of defects into the semiconductor layer thus is subjected to the etching process. The active layer 12 containing N therein is particularly susceptible to defects, in view of rapid deteriorating crystal quality with increasing content of N in the crystal.

In the device of FIG. 2, the problem of defect formation and associated non-optical recombination of carriers is successfully avoided by forming the current confinement structures 14 above the active layer 12 with a separation therefrom. On the other hand, such a construction naturally allows a lateral diffusion of the injected holes away from the region immediately under the ridge structure as indicated by arrows in FIG. 2. Thereby, the threshold current of laser oscillation increases and the efficiency of laser oscillation is deteriorated substantially.

SUMMARY OF THE INVENTION

Accordingly, it is a general object of the present invention to provide a novel and useful laser diode wherein the foregoing problems are eliminated.

Another and more specific object of the present invention is to provide a laser diode operable in a 1.3 or 1.5 $\mu$m wavelength band wherein the efficiency of laser oscillation is improved.

Another object of the present invention is to provide a laser diode having an active layer of a group III–V compound semiconductor material containing N as a group V element, wherein a ridge stripe is formed by a mesa structure extending in an axial direction of the laser diode such that a mesa wall reaches below a level of the active layer, and wherein the problem of non-optical recombination of carriers at the lateral edges of the active layer is successfully eliminated.

Another object of the present invention is to provide an edge-emission type laser diode, comprising:

a substrate of a first conductivity type;

a lower cladding layer of said first conductivity type provided on said substrate;

an active layer of an undoped group III–V compound semiconductor material containing therein N and As as group V elements;

an upper cladding layer of a second, opposite conductivity type provided on said active layer;

a first ohmic electrode provided on said upper cladding layer for injecting carriers of a first polarity into said active layer via said upper cladding layer; and a lower ohmic electrode provided on a lower major surface of said substrate for injecting carriers of a second, opposite polarity into said active layer via said substrate and said lower cladding layer;

at least said active layer and said lower cladding layer forming a mesa structure laterally defined by a pair of mesa walls and extending in an axial direction of said laser diode, said active layer having first and second lateral edges exposed respectively at said pair of mesa walls, each of said first and second lateral edges of said active layer having a modified composition and a correspondingly increased bandgap.

According to the present invention, the active layer of the laser diode contains a small amount of N as a group V element, in addition to As. Thereby, the laser diode oscillates at the optical wavelength of 1.3 or 1.5 μm. Further, the active layer of the laser diode is laterally defined by the first and second lateral edges, wherein the bandgap is increased at the first and second lateral edges as compared with a region inside the active region. Thereby, the carriers injected into the active layer do not reach the lateral edges, and the problem of non-optical recombination of the carriers, caused by defects included in such exposed laterals edges, is successfully avoided.

Another object of the present invention is to provide a vertical-cavity surface-emitting laser diode, comprising:
 a substrate;
 a lower multilayer reflection structure provided on said substrate;
 a lower cladding layer of a first conductivity type provided on said lower multilayer reflection structure;
 an active layer of an undoped group III–V compound semiconductor material containing therein N and As as group V elements, said active layer being provided on said lower cladding layer;
 an upper cladding layer of a second, opposite conductivity type, provided on said active layer;
 an upper multilayer reflection structure provided on said upper cladding layer;
 an upper ohmic electrode for injecting carriers of a first polarity into said active layer; and
 a lower ohmic electrode for injecting carriers of a second, opposite conductivity type into said active layer;
 at least said active layer and said lower cladding layer forming a structure defined by a pair of side walls on said lower multilayer reflection structure,
 said active layer having first and second lateral edges exposed respectively at said pair of side walls, each of said first and second lateral edges of said active layer having an modified composition and a correspondingly increased bandgap.

According to the present invention, too, the active layer of the vertical-cavity surface-emitting laser diode contains a small amount of N as a group V element, in addition to As. Thereby, the laser diode oscillates at the optical wavelength of 1.3 or 1.5 μm. Further, the active layer of the laser diode is laterally defined by the first and second lateral edges, wherein the bandgap is increased at the first and second lateral edges as compared with a region inside the active region. Thereby, the carriers injected into the active layer do not reach the lateral edges, and the problem of non-optical recombination of the carriers is successfully avoided.

Another object of the present invention is to provide a method of fabricating an optical semiconductor device operable in a 1.3 μm or 1.5 μm wavelength band, comprising the steps of:
 forming a lower cladding layer on a substrate;
 forming an active layer of a group III–V compound semiconductor device containing N and As as a group V element, on said lower cladding layer;
 forming a mesa structure including at least said active layer and said lower cladding layer, such that said mesa structure is defined by a pair of mesa walls and such that said active layer is exposed at said mesa wall; and
 substituting N atoms in an exposed part of said active layer by As atoms.

According to the present invention, the N atoms in the exposed lateral edges of the active layer are replaced by the As atoms and a widegap material is formed in the active layer in correspondence to the exposed lateral edges. Thereby, the problem of non-optical recombination of carriers at such exposed lateral edges of the active layer is successfully eliminated.

Other objects and further features of the present invention will become apparent from the following detailed description when read in conjunction with the attached drawings.

DETAILED DESCRIPTION OF THE PREFERRED EMBODIMENTS

Figure 1:
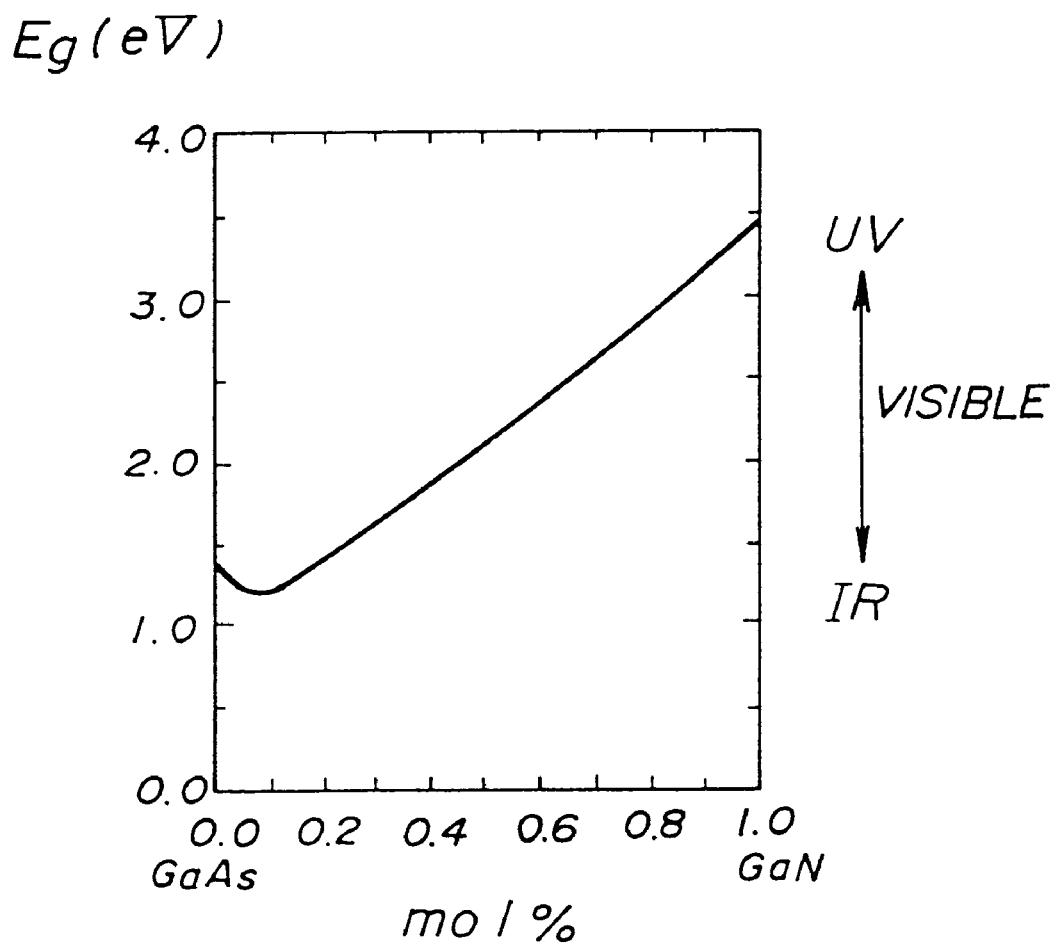
FIG. 1 is a diagram showing a bandgap-composition relationship of a GaAs-GaN system.
Figure 2:
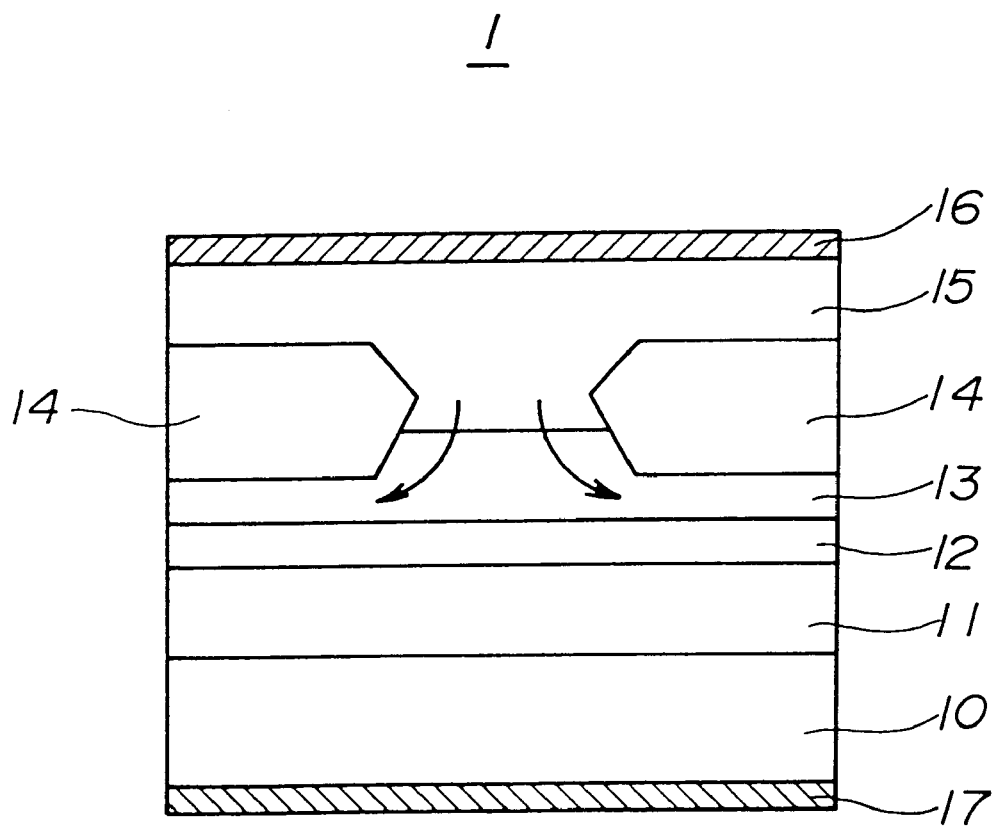
FIG. 2 is a diagram showing the construction of a conventional laser diode operable in a 1.3 μm or 1.5 μm band.
Figure 3:
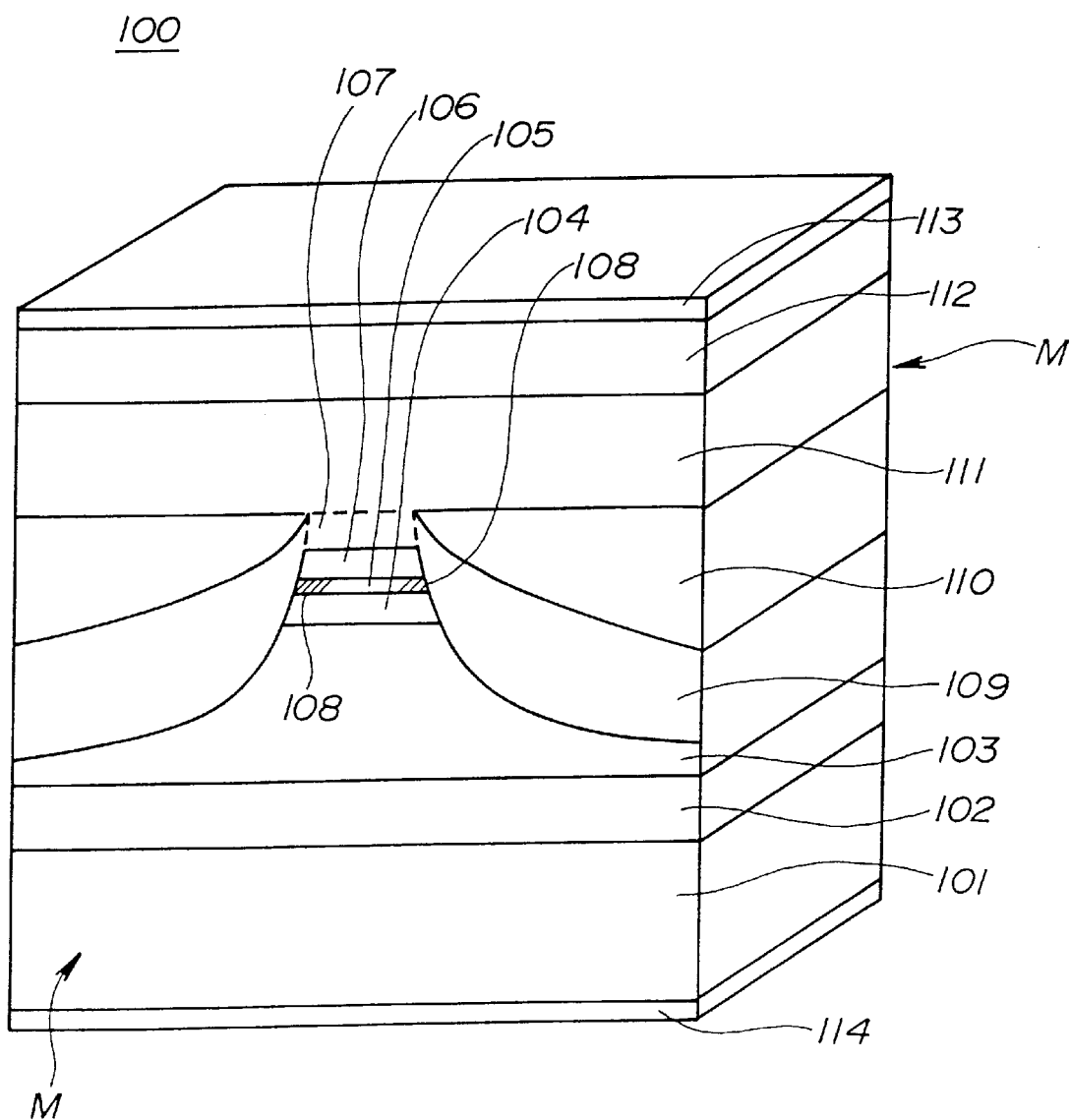
FIG. 3 is a diagram showing the construction of a an edge-emission type laser diode according to a first embodiment of the present invention.

FIG. 3 shows the construction of an edge-emission type laser diode 100 according to a first embodiment of the present invention.

Referring to FIG. 3, the laser diode 100 is constructed on a substrate 101 of n-type GaAs and includes a buffer layer 102 of n-type GaAs provided on the substrate 101 epitaxially with a thickness of typically about 500 nm. On the buffer layer 102, a lower cladding layer 103 of n-type AlGaAs is provided epitaxially with a thickness of typically about 1500 nm. Further, a lower optical guide layer 104 of undoped GaAs is provided on the lower cladding layer 103 epitaxially with a thickness of typically about 100 nm, and an active layer 105 of undoped GaInNAs is provided on the lower optical guide layer 104 epitaxially with a thickness of typically about 10 nm.

The active layer 105 has a composition of $Ga_xIn_{1-x}N_yAs_{1-y}$ and achieves a lattice matching with the GaAs substrate 101. Further, the active layer 105 has a bandgap of 0.95 eV corresponding to the optical wavelength of 1.3 μm or 0.82 eV corresponding to the optical wavelength of 1.5 μm.

On the active layer 105, an upper optical waveguide layer 106 of undoped GaAs is provided epitaxially with a thickness of about 100 nm, and a ptype AlGaAs layer 107 of the p-type is provided further on the upper optical waveguide layer 106 with a thickness of about 500 nm as a part of the upper cladding layer to be formed.

It should be noted that the layers 103–107 form together a mesa structure defined by sloped lateral walls and extending in an axial direction of the laser diode, and a current blocking layer 109 of p-type AlGaAs and another current blocking layer 110 of n-type AlGaAs are deposited consecutively at each lateral side of the mesa structure.

Further, an upper cladding layer 111 of p-type AlGaAs and a contact layer 112 of p-type GaAs are provided consecutively on the p-type AlGaAs layer 107, and an upper ohmic electrode 113 of an AuZn/Zn stacked structure is provided on the contact layer 112. Further, a lower ohmic electrode 114 of an AuGe/Ni/Au stacked structure is provided on the lower major surface of the substrate 101.

In the structure of FIG. 3, it should be noted that the active layer 105 of GaInNAs is formed by an MOVPE process that uses a nitrogen compound such as dimethylhydrazine (DMHy) as the source of N. Further, the laser diode 100 is axially defined by a pair of mirrors M that form an optical cavity. The mirrors M may be formed of cleaved surfaces, as usual in the art of laser diode.

It should be noted that the mesa structure exposes both lateral edges of the active layer 105 as a result of the mesa formation. Because of the etching process that is used in the process of forming the mesa structure, the exposed lateral edges of the active layer tend to include substantial defects, while such defects tend to act as a non-optical recombination center. Thereby, a substantial amount of drive current, injected from the electrodes 113 and 114, is consumed at such non-optical recombination centers, without contributing to the photon emission.

Thus, in order to avoid the foregoing problem, the present embodiment forms a region 108 where the N atoms are substituted by the As atoms. In other words, the region 108 of the active layer 105 has a composition of GaInAs. Thereby, the region 108 has a bandgap substantially larger than the bandgap inside the active layer 105, and the carriers injected to the active layer 105 are confined laterally by the regions 108. In other words, the carriers avoid the non-optical recombination centers at the lateral edges of the active layer 105, and the efficiency of laser oscillation is improved substantially.

The laser diode of FIG. 3 has the so-called SCH (separate confinement heterostructure)—SQW (single quantum well) structure in which the active layer 105 is vertically sandwiched by the GaAs layers 104 and 106 between the cladding layers 103 and 107. By using GaAs for the layers 104 and 106 rather than using AlGaAs, which is used for the cladding layers 103 and 107, the problem of non-optical recombination of carriers caused by Al, is successfully avoided. Further, the current blocking layers 109 and 110 not only act to confine the carriers in the mesa stripe but also the optical radiation produced in the active layer 105 as a result of stimulated emission.

As already noted, the laser diode of FIG. 3 operates in the 1.3 μm or 1.5 μm wavelength band, wherein the laser diode has a prolonged lifetime due to the excellent lattice matching of the active layer 105 to the GaAs substrate 101. As there is formed a large band discontinuity in the conduction band between the active layer 105 and the cladding layer 102 or 111, the carriers are confined efficiently in the active layer 105 even at high temperatures, and a high efficiency of laser oscillation is maintained even when the laser diode is operated at high temperatures.

Figure 4A:
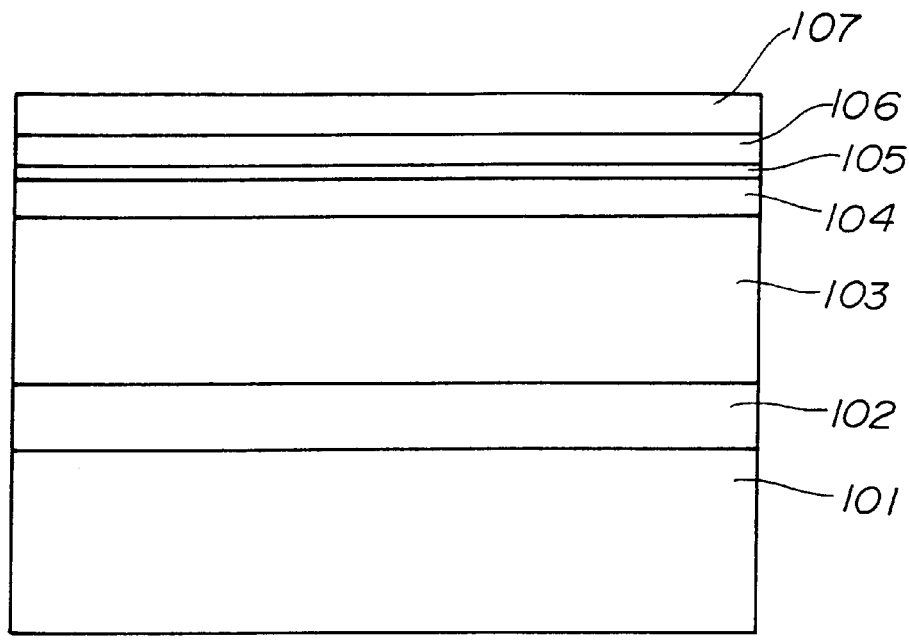
FIGS. 4A–4C are diagrams showing the fabrication process of the laser diode of FIG. 3.
Figure 4B:
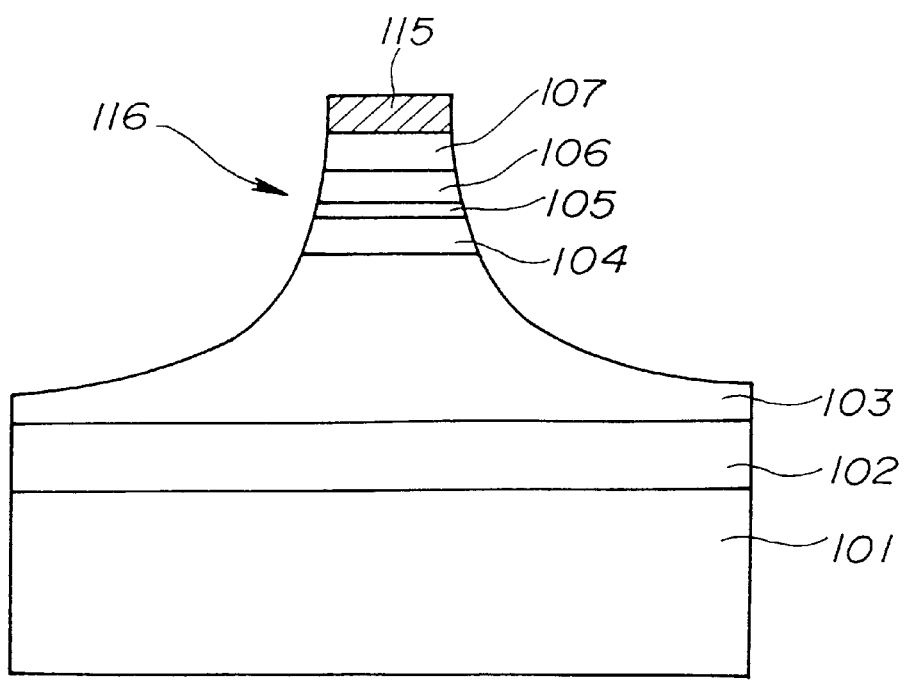
Figure 4C:
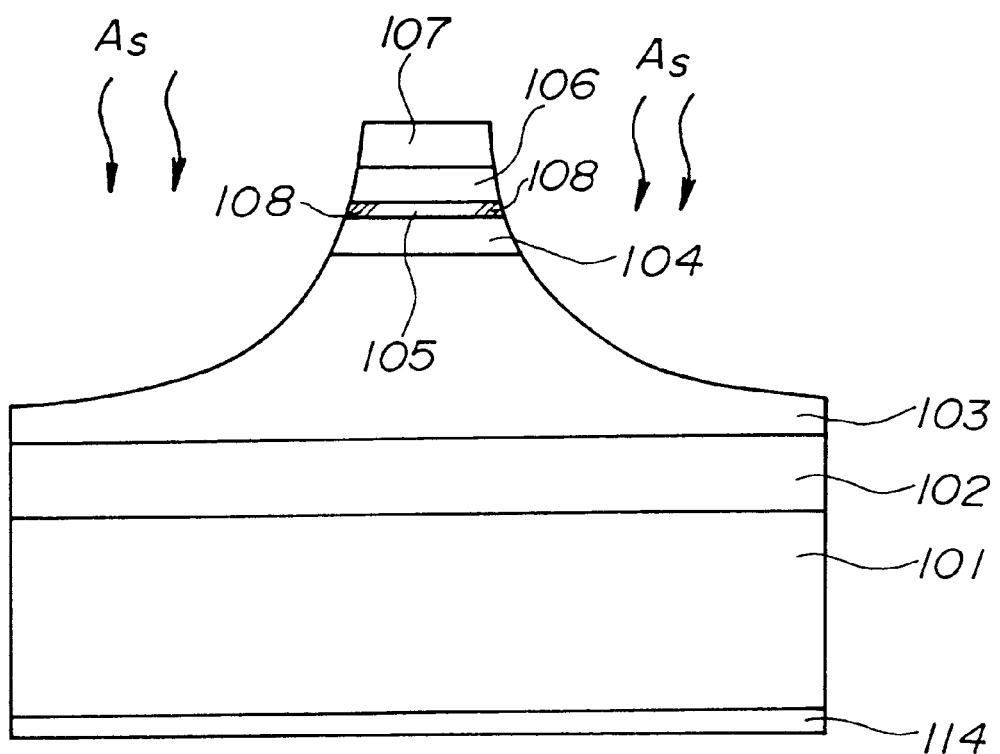

FIGS. 4A–4C show the fabrication process of the laser diode 100 of FIG. 3.

Referring to FIG. 4A, a layered structure including the foregoing semiconductor layers 102–107, is formed on the substrate 101 as described already with reference to FIG. 3. The layers 102–107 may be deposited in a reaction vessel of a deposition apparatus by an MOVPE process, wherein the deposition of the GaInNAs layer 105 may be conducted by using DMHy as noted already. During the deposition of the GaInNAs layer, the internal pressure of the reaction chamber is typically set to $1.3 \times 10^4$ Pa, and the deposition may be made at a substrate temperature of 630° C. by supplying TMG, TMIn, DMHy and AsH$_3$ (arsine) as respective gaseous sources of Ga, In, N and As.

Next, in the step of FIG. 4B, a mesa etching is applied to the structure of FIG. 4A by a wet etching process while using a resist pattern 115 as an etching mask. Thereby, a mesa structure 116 is formed from the layered structure of FIG. 4A. It should be noted that the mesa etching reaches the lower cladding layer 103, and the lateral edges of the active layer 105 is exposed at the mesa side walls.

Next, in the step of FIG. 4C, the structure of FIG. 4B is annealed, after removing the resist mask 115, in an AsH$_3$ atmosphere at a temperature of 630° C. for 30 minutes. Thereby, the N atoms in the active layer GaInNAs 105 are substituted at the exposed lateral edges by the As atoms, and the regions 108 of GaInAs are formed as a result of such a substitution. Each of the regions 108 has a very limited size and covers only the surface of the foregoing lateral edges. The illustration of FIG. 3 or FIG. 4C is substantially exaggerated for facilitating the understanding.

After the step of FIG. 4C, the layers 109–112 are deposited by an MOVPE process as is well known in the art of stripe laser diode having a BH (buried-hetero) structure.

In the foregoing process, it should be noted that the annealing of FIG. 4C for forming the GaInAs regions 108 is conducted in the same deposition apparatus used for depositing the current blocking layers 109 and 110, by merely changing the gas composition supplied to the reaction chamber. Thereby, the increase of fabrication cost of the laser diode by such an annealing process is successfully avoided.

In the device of FIG. 3, it should be noted that the current blocking layers 109 and 110 may be formed of GaInPAs including InGaP, with a composition set to form a lattice matching with the GaAs substrate 101. When the current blocking layers 109 and 110 are to be formed of GaInP, the AsH$_3$ atmosphere used in the step of FIG. 4C for forming the GaInAs regions 108 is switched to a PH$_3$ (phosphine) atmosphere when depositing the GaInP current blocking layers 109 and 110. Further, the current blocking layers 109 and 110 may be formed of GaInPAs, by supplying a mixture of AsH$_3$ and PH$_3$ after the foregoing annealing step.

It should be noted that the foregoing process of forming the GaInAs regions 108 is not limited to the SBR laser diode explained with reference to FIG. 3, but is effective also in a general stripe laser diode including the device in which the formation of the current blocking layers 109 and 110 is not made.

Next, a vertical-cavity surface-emitting laser diode 200 according to a second embodiment of the present invention will be described with reference to FIG. 5.

Figure 5:
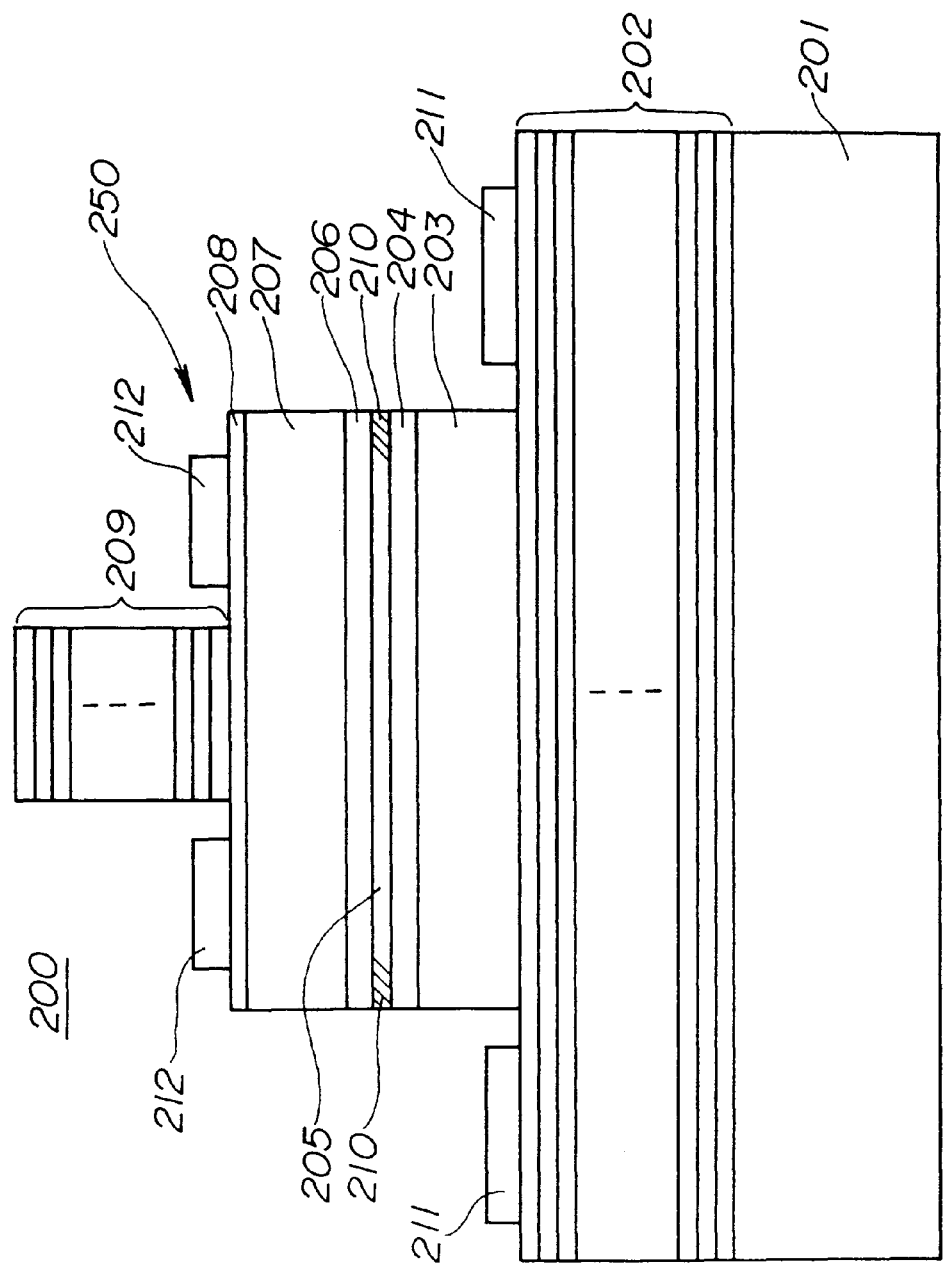
FIG. 5 is a diagram showing the construction of a vertical-cavity surface-emitting laser diode according to a second embodiment of the present invention.

Referring to FIG. 5, the vertical-cavity surface-emitting laser diode 200 is constructed on a substrate 201 of n-type GaAs, on which a multilayer reflector 202 is formed in the form of an alternate repetition of a first epitaxial layer of n-type AlGaAs and a second epitaxial layer of n-type GaAs. Typically, the first and second epitaxial layers are repeated for 24 times in the multilayer reflector 202, and a lower cladding layer 203 of n-type AlGaAs is provided on the multilayer reflector 202 epitaxially with a thickness of typically about 500 nm.

On the lower cladding layer 203, a lower optical waveguide layer 204 of undoped GaAs is provided epitaxially with a thickness of typically about 100 nm, and an active layer 205 of undoped GaInNAs is provided further on the optical waveguide layer 204 epitaxially with a thickness of typically about 10 nm.

On the active layer 205, an upper optical waveguide layer 206 of undoped GaAs is provided epitaxially with a thickness of typically about 100 nm, and an upper cladding layer 207 of p-type AlGaAs is provided on the upper optical waveguide layer 206 epitaxially with a thickness of typically about 500 nm. Further, a contact layer 208 of p-type GaAs is provided on the upper cladding layer 207 epitaxially with a thickness of about 100 nm.

The layers 203–208 are then subjected to a dry etching process, to form a layered body 250 on an optical axis of the laser diode to be formed, wherein the layered body 250 is defined by substantially vertical side walls, and a part of the top surface of the lower multilayer reflector 202 is exposed as indicated in FIG. 5. Further, ohmic electrodes 211 having an AuGe/Ni/Au stacked structure are provided on the exposed top surface of the lower multilayer reflector 202.

On the contact layer 208, an upper multilayer reflector 209 is formed as an alternate repetition of an undoped GaAs layer and an undoped AlGaAs layer in alignment with the optical axis of the laser diode, and upper ohmic electrodes 212 of a Cr/Au stacked structure is provided on the exposed top surface of the contact layer 208.

In the vertical-cavity surface-emitting laser diode of FIG. 5, it should be noted that the side walls of the layered body 250 expose lateral edges of the active layer 205, and regions 210 having a modified composition of GaInAs are formed at such exposed lateral edges of the active layer 205, by substituting the N atoms by As atoms similarly to the first embodiment. Similarly to the previous embodiment, the regions 210, having an increased bandgap as compared with the rest of the active layer 205, expel the carriers penetrating thereinto, and the problem of non-optical recombination of the carriers by the defects in the regions 210, is successfully avoided. The region 210 may be formed by carrying out a thermal annealing process in an $AsH_3$ atmosphere conducted at a temperature of about 630° C. for 30 minutes, similarly as before. The annealing is preferably made before forming the upper multilayer reflector 209 or the electrodes 211 and 212.

It should be noted that the vertical-cavity surface-emitting laser diode of FIG. 5 oscillates efficiently at the wavelength of 1.3 μm or 1.5 μm band while successfully using GaAs for the substrate 201. As a result of the use of GaAs for the substrate 201, it becomes possible to form the lower and upper multilayer reflectors 202 and 209 by the stacking a GaAs layer and an AlGaAs layer as already noted. Thereby, a very large change of refractive index is induced in-the reflection structures as compared with the conventional case of using InP for the substrate 201, and the number of repetitions of the GaAs/AlGaAs stacking in the lower or upper multilayer reflectors is reduced to one-half or less. When InP is used for the substrate 201, the upper or lower multilayer reflectors has to be formed by an alternate stacking of InP and InGaAsP, while such a construction can provide a refractive index change of only 0.25. By using the alternate stacking of GaAs and AlGaAs, with the composition of AlGaAs layer set coincident to AlAs, a refractive index change of as much as 0.5 can be achieved. Thereby, the throughput of fabrication of the laser diode is improved substantially and hence the cost of the device.

In addition to the foregoing advantageous optical feature, the vertical-cavity surface-emitting laser diode of FIG. 5 has an advantageous feature of excellent carrier accumulation in the active layer 210 due to the large band discontinuity ΔEc in the conduction band between the active layer 210 and the cladding layer 203 or 207. Thereby, the laser diode oscillates efficiently even at high temperatures, without providing an external cooling device, and the cost of the laser diode is reduced substantially.

Further, the present invention is not limited to the embodiments described heretofore, but various variations and modifications may be made without departing from the scope of the invention.

What is claimed is:

1. A vertical-cavity surface-emitting laser diode, comprising:

a substrate;

a lower multilayer reflection structure provided on said substrate;

a lower cladding layer of a first conductivity type provided on said lower multilayer reflection structure;

an active layer of an undoped group III–V compound semiconductor material containing therein N and As as group V elements, said active layer being provided on said lower cladding layer;

an upper cladding layer of a second, opposite conductivity type, provided on said active layer;

an upper multilayer reflection structure provided on said upper cladding layer;

an upper ohmic electrode for injecting carriers of a first polarity into said active layer; and a lower ohmic electrode for injecting carriers of a second, opposite conductivity type into said active layer;

at least said active layer and said lower cladding layer forming a structure defined by a pair of side walls on said lower multilayer reflection structure, said active layer having first and second lateral edges exposed respectively at said pair of side walls, each of said first and second lateral edges of said active layer having a modified composition and a correspondingly increased bandgap.

2. A vertical-cavity surface-emitting laser diode as claimed in claim 1, wherein said active layer has a composition of GaInNAs, and wherein said first and second lateral edges of the active layer has a composition of GaInAs.

3. A vertical-cavity surface-emitting laser diode as claimed in claim 1, wherein said substrate is formed of GaAs, and wherein said active layer has a composition of $Ga_xIn_{1-x}N_yAs_{1-y}$.

4. A vertical-cavity surface-emitting laser diode as claimed in claim 1, wherein said substrate is formed of GaAs, and wherein each of said upper and lower multilayer reflection structures are formed of an alternate stacking of a GaAs layer and an AlGaAs layer having a composition of $Al_xGa_{1-x}As$ where $0<x\leq1$.

* * * * *